United States Patent [19]
Kruse

[11] Patent Number: 5,640,107
[45] Date of Patent: Jun. 17, 1997

[54] METHOD FOR IN-CIRCUIT PROGRAMMING OF A FIELD-PROGRAMMABLE GATE ARRAY CONFIGURATION MEMORY

[75] Inventor: Neils A. Kruse, Cary, Ill.

[73] Assignee: Northrop Grumman Corporation, Los Angeles, Calif.

[21] Appl. No.: 547,351

[22] Filed: Oct. 24, 1995

[51] Int. Cl.⁶ .................................. H03K 19/177
[52] U.S. Cl. ............................. 326/38; 326/41
[58] Field of Search ...................... 326/38–41, 47

[56] References Cited

U.S. PATENT DOCUMENTS

| | | | |
|---|---|---|---|
| 4,780,846 | 10/1988 | Tanabe et al. | 326/41 X |
| 4,870,302 | 9/1989 | Freeman | 326/41 |
| 5,271,887 | 12/1993 | Wiech, Jr. | 264/61 |
| 5,361,373 | 11/1994 | Gilson | 395/800 |
| 5,432,708 | 7/1995 | Mohsen | 364/490 |
| 5,440,453 | 8/1995 | Cooke et al. | 361/790 |
| 5,493,239 | 2/1996 | Zlotnick | 326/38 |

*Primary Examiner*—David R. Hudspeth
*Attorney, Agent, or Firm*—Terry J. Anderson; Karl J. Hoch, Jr.

[57] ABSTRACT

A programmable logic circuit includes a non-volatile, in-circuit programmable FPGA memory containing configuration data for programming an FPGA to perform one or more desired logic functions. The chips in the circuit may be packaged individually or may be mounted in die form on a multichip module. A method for programming an FPGA memory includes the steps of downloading a first set of data into an FPGA to program the FPGA to function as an FPGA memory programmer, and then downloading a second set of data into the FPGA, the second set of data being of a type for programming the FPGA to perform one or more logic functions. The second set of data, however, is not immediately loaded into the FPGA but instead is programmed into the FPGA memory in a manner controlled by the programming function of the FPGA. A method for programming an FPGA includes as a step the aforementioned method. A multichip module contains an FPGA die and FPGA memory die, either of which may be programmed in accordance with the methods described above.

16 Claims, 5 Drawing Sheets

METHOD FOR IN-CIRCUIT PROGRAMMING OF A FIELD-PROGRAMMABLE GATE ARRAY CONFIGURATION MEMORY

BACKGROUND OF THE INVENTION

1. Field of the Invention.

This invention generally relates to programmable logic circuits, and more particularly to a method for programming a field-programmable gate array with configuration data stored in a memory chip.

2. Description of the Related Art.

Integrated circuits known as programmable logic arrays (PLAs) employ a fixed number of logic gates, and sometimes flip-flop circuits, on a single chip to perform custom logic functions. Their appeal lies mainly in their versatility. A single PLA chip can, for example, perform the work of several single-function IC chips, thereby advantageously conserving space and reducing the cost and complexity of the overall system in which it is employed.

The logic gates of early PLAs were constructed from bipolar transistor elements arranged in an emitter-follower configuration on a silicon chip. Included in each transistor element was a nichrome fuse linking the emitter of the transistor to a bit line connecting the emitters of other gates in the array.

Programming these primitive PLAs was performed by the manufacturer using a hardware approach. Special programming equipment was used to blow fuses in selected gate-transistor elements according to a pattern that would satisfy a program table defining the combinational logic functions to be performed by the PLA.

This primitive form of PLA chip technology presented a number of disadvantages, not only in terms of their relatively low processing capability but also in terms of complications associated with programming them. For example, each PLA necessarily had to be programmed prior to its insertion into the system circuitry. This made standardization impossible because each chip essentially had to be custom made by the manufacturer, which added significantly to the time, cost, and complexity of the PLA manufacturing process.

Furthermore, because the fuse-blowing technique was essentially a destructive process, programming a PLA was often irreversible. In order to change the functionality of a PLA, the customer had to send it back to the manufacturer, who would then physically remove the PLA from the circuit, reprogram it by blowing a new fuse pattern, if possible, and reinsert it into the circuit. If reprogramming proved to be impossible, the manufacturer had to program and install a new chip into the system.

The development of electrically erasable gate-transistors significantly improved PLA performance and programming techniques, to the benefit of both the chip customer and chip manufacturer. With this technology, PLAs can achieve a lower part count, lower power dissipation, higher processing speed, and greater system flexibility compared with their more rudimentary ancestors.

Equally important, electrically erasable gates make it possible for PLAs to be programmed, after manufacture, using a software approach, which essentially involves transferring special data, known as configuration data, from an external memory into a memory built directly into the PLA chip. Once inside, the data is used to alter the electrical state of selected gates in the chip, in an manner analogous to blowing fuses, to achieve the desired logic configuration. Because this method of programming can be performed in the field, PLAs made from electrically erasable gates have come to be known as field-programmable gate arrays (FPGAs).

Various types of memories have been used for storing FPGA configuration data. U.S. Pat. No. 5,249,164 to Koz, for example, discloses a system which uses a ROM chip to store FPGA configuration data.

There are, however, a number of drawbacks associated with using a ROM as an FPGA memory. For example, because a ROM chip cannot be programmed once it has been inserted into the system (i.e., it is not "in-circuit" programmable), programming of the ROM chip with FPGA configuration data must be performed by the manufacturer before installation into the system circuitry.

In addition, logic functions to be performed by the FPGA can be changed only by physically removing the ROM and either reprogramming it or replacing it with a new ROM chip loaded with different configuration data. In at least these respects, then, use of a ROM chip as an FPGA memory is, for all practical purposes, a throw back to the fuse blowing techniques previously discussed.

U.S. Pat. Nos. 5,150,048 and 5,243,273 to McAuliffe et at. disclose systems which use RAM chips as FPGA memories. Because a RAM is in-circuit programmable, the role of the chip manufacturer can be eliminated from the manufacturing loop. Advantageously, the customer himself can program the FPGA after the chip manufacturer has installed it into the system, by loading configuration data into the FPGA RAM. Moreover, the customer can change the functionality of the chip by reprogramming it with new configuration data. Other RAM-based FPGAs are disclosed in U.S. Pat. Nos. 5,361,373 and 4,870,302.

In spite of these advantages, the systems disclosed in the McAuliffe patents are not optimal because of inherent limitations associated with the use of a RAM as FPGA memory. For example, a RAM is a temporary storage device known as a static memory. Data stored within it remains there only for as long as power is being supplied it. As soon as the power is shut off, the entire contents of a RAM is lost. The static nature of an FPGA RAM therefore necessarily requires configuration data to be loaded into it every time power to the system is turned on. The associated delays and additional hardware required to load the RAM each time power is turned on adds significantly to the cost and complexity of the FPGA system.

From the foregoing discussion, it is evident that the performance of FPGA systems, and the methods used to program them, are now limited less by the hardware limitations of the FPGA chips themselves, and more by limitations associated with the memory used to store FPGA configuration data, and, as will now be explained, by limitations associated with other FPGA system hardware components.

Over the past 30 years, there has been an exponential growth in transistor speed and in the number of transistors per chip. Chip interconnection speeds and I/O counts, however, have failed to increase at a commensurate rate, thereby preventing the performance of integrated circuits from reaching their full potential.

The inability of chip packaging technology to keep pace has also limited FPGA performance. External leads on conventional through-hole and surface mount IC packages degrade performance because they have associated with them parasitic capacitances and inductances which distort the shape of the signals passing through them.

Recent advances in packaging and interconnection technologies have improved IC performance. This may be best exemplified by the multichip module (MCM).

Generally speaking, an MCM includes two or more bare integrated circuit chips, often referred to as "dies," mounted on a common circuit base. The dies are interconnected by signal, power, and ground wires incorporated within the base. Each die contains a plurality of bonding pads along its periphery which function as input/output (I/O) terminals for the integrated circuit contained therein. Very fine wires, typically a fraction of a millimeter in diameter, are used to establish electrical connection between the bonding pads and the wires in the base. All of the aforementioned components are then encapsulated within an outer protective packaging, which then may be mounted on a printed wiring board to establish electrical connection with system circuitry. Microchip modules are disclosed in the publication *Microchip Module Technologies and Alternatives* by Doane and Franzon, Van Nostrand Reinhold publisher, and in U.S. Pat. Nos. 5,271,887 and 5,432,708.

The MCM packaging philosophy reduces the average spacing between ICs in an electronic system to achieve a myriad of advantages over conventional IC packages. MCM packages, for example, are substantially smaller in size and therefore take up less board space within the system circuit. MCM packages also require comparatively fewer chip connections and interconnections. This, in turn, translates into a reduction in parasitic capacitances and inductances and signal delays, all of which increase overall system speed and reliability.

MCM packages containing logic circuits such as those typically found in FPGAs have been disclosed. See, for example, U.S. Pat. No. 5,432,708. No prior art reference, however, teaches or suggests an MCM equipped with FPGA and an FPGA memory dies for performing one or more system functions, nor has there been disclosed a method for programming and reprogramming such a system.

It is therefore clear, based on the foregoing discussion, that there are at least two long-felt needs which have been left unsatisfied by the prior art.

The first relates to memories for holding configuration data for programming an FPGA. Systems which use ROM-based FPGA memories, while advantageously non-volatile, have proven to be inadequate because they are not in-circuit programmable. RAM-based FPGA memories, while in-circuit programmable, are inefficient because they need to be reprogrammed every time the system power is turned on. Thus, there is a need for the selection of an FPGA memory that will optimize the overall performance of the system in which it is employed, and further one which will improve the speed, cost, and efficiency of programming and reprogramming such a system.

Second, there is a need for FPGA-based system which has improved speed and performance realized by incorporating the FPGA and FPGA memory in die form within an MCM package.

SUMMARY OF THE INVENTION

It is a first objective of the present invention to provide a programmable logic circuit which employs an FPGA memory which optimizes the performance of the circuit by realizing all of the advantages of prior art FPGA memories without realizing any of their disadvantages.

It is a second objective of the present invention to accomplish the first objective by selecting the FPGA memory to be both non-volatile and in-circuit programmable.

It is a third objective of the present invention to incorporate the aforementioned programmable logic circuit within an MCM package.

It is a fourth objective of the present invention to provide a method for programming an FPGA memory while in circuit in way which is a more efficient and economical compared with prior art methods.

It is a fifth objective of the present invention to accomplish the fourth objective by using the FPGA to program the FPGA memory.

It is a sixth objective of the present invention to provide a method for programming an FPGA memory that will, in a way more efficient than prior art methods, permit the customer/user of the FPGA system to program and reprogram an FPGA memory as desired, instead of the manufacturer.

It is a seventh objective of the present invention to provide a method for programming an FPGA memory that can be implemented equally well regardless of the type of packaging technology used to package the FPGA and FPGA memory.

It is a eighth objective of the present invention to provide a method for programming an FPGA which includes as a step any of the previously described methods for programming an FPGA memory.

It is a ninth objective of the present invention to provide a method for programming an FPGA that can be implemented equally well regardless of the type of packaging technology used to package the FPGA and FPGA memory.

It is a tenth objective of the present invention to provide an MCM containing an FPGA-based circuit which includes both the FPGA circuit die and the FPGA memory die interconnected on a common base.

The foregoing and other objectives of the invention are achieved by providing a programmable logic circuit for performing one or more desired logic functions. The circuit is equipped with an FPGA memory that is selected to be both non-volatile and in-circuit programmable. EEPROMs, EPROMs, and PROMs are eligible candidates. The FPGA and FPGA memory chips may be packaged individually using conventional techniques, or may be packaged within an multichip module.

Selecting a non-volatile, programmable FPGA memory allows the circuit of the present invention to achieve significant advantages. Initial programming of the FPGA memory, for example, need only be performed once. This increases the speed and efficiency of the circuit by eliminating delays associated with having to reprogram the FPGA memory at every power up. Also, selecting the FPGA memory to be non-volatile reduces the hardware requirements, and consequently the cost and complexity, of the host system of the FPGA circuit.

In addition, the FPGA memory can be programmed, and reprogrammed if desired, by the customer after the memory has been installed in circuit. This adds to the versatility and convenience of the circuit by making standardization possible. The manufacturer, for example, can manufacture the circuit of the present invention as a single generic part which can be programmed by the customer to perform, within reason, virtually any application desired.

The present invention also contemplates a method for programming an FPGA memory with configuration data to be subsequently used to program an FPGA. The central focus of the method is to use the FPGA to program the FPGA memory. This reduces the amount of hardware, and thus the cost, required to accomplish the programming task.

The steps of the method include connecting a download cable between the FPGA and an external source, downloading a first set of data into the FPGA to program the FPGA to function as an FPGA memory programmer, and then downloading a second set of data, for programming the FPGA to perform its one or more system functions, into the FPGA. The second set of data, however, is not loaded into the FPGA at this time. Instead, it is programmed into the FPGA memory in a manner controlled by the programming function of the FPGA. Reprogramming of the FPGA memory may be accomplished by repeating the method with a different second set of configuration data.

The present invention also contemplates a method for programming an FPGA, which includes the steps of selecting a non-volatile, programmable memory to serve as an FPGA memory, programming that memory in accordance with the method described immediately above, removing power from the FPGA to cause the first set of data stored therein to become lost, and then returning power to the FPGA and FPGA memory to cause the FPGA memory to load configuration data into the FPGA, thereby programming the FPGA to perform its one or more system functions.

The present invention also contemplates an MCM containing an FPGA die and a FPGA memory die mounted on a common circuit base. Preferably, the FPGA memory is selected to be non-volatile and in-circuit programmable. The FPGA and FPGA memory dies therefore may be programmed in accordance with the previously described methods.

The MCM achieves advantages which could not be achieved if the FPGA and FPGA memory were otherwise packaged. For example, the MCM has fewer chip connections and interconnections than would be required if the chips were individually packaged. This translates into a reduction of parasitic effects and a corresponding increase in the performance and reliability of the FPGA circuit.

DESCRIPTION OF THE PREFERRED EMBODIMENTS

The present invention is, in one respect, a programmable logic circuit containing an FPGA and FPGA memory for performing one or more desired functions. In a second respect, the present invention is a method for programming an FPGA memory with configuration data to be subsequently used for programming an FPGA. In a third respect, the present invention is a method for programming an FPGA which includes as a step programming an FPGA memory in accordance with the aforementioned method. In a fourth respect, the present invention is an MCM incorporating FPGA and FPGA memory dies on a common circuit base.

Figure 1:
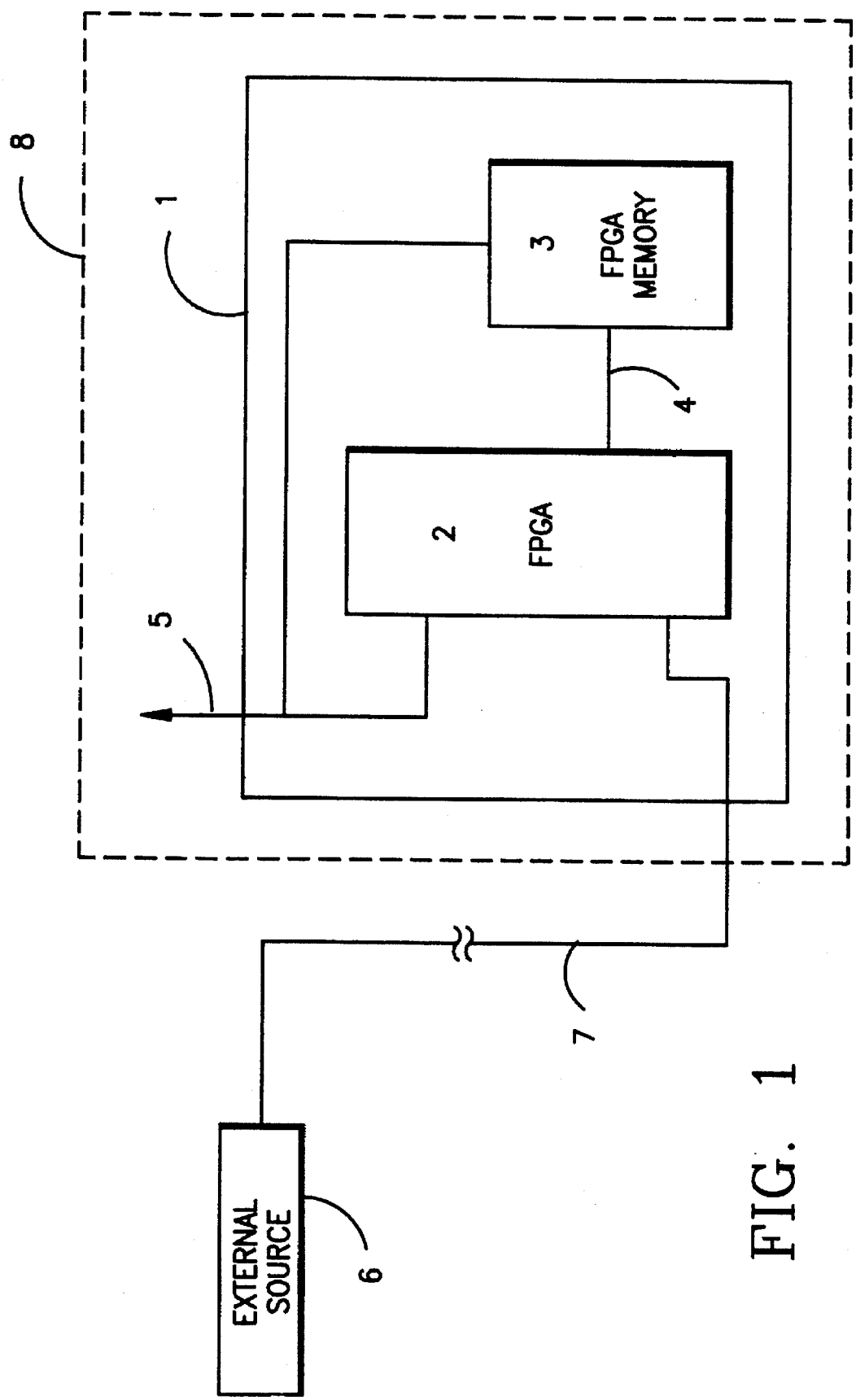
FIG. 1 is a schematic diagram of a preferred embodiment of the programmable logic circuit of the present invention.

As shown in FIG. 1, a preferred embodiment of the programmable logic circuit of the present invention includes an FPGA 2, an FPGA memory 3, a plurality of data lines 4 interconnecting the FPGA to the FPGA memory, a printed circuit board 1 on which is mounted the FPGA and FPGA memory, and a power supply 5. Circuit board 1 may be included as part of a larger system circuit 8 for performing logic functions therein.

The FPGA contains a plurality of electrically erasable logic gates which can be configured to perform one or more combinational logic functions. Also included in the FPGA is an internal storage device (not shown) for receiving configuration data for defining the functionality of the FPGA. The storage device preferably is a static memory, which, in turn, enables the initial programming of the FPGA to be altered in a manner to be described herein.

The FPGA memory is advantageously selected to be a non-volatile memory for storing configuration data defining the functionality of the FPGA. Examples of non-volatile programmable memories which are especially advantageous for use in the circuit of the present invention include EEPROM, EPROM, PROM and the like.

In operation, when power is supplied to the FPGA and FPGA memory from supply 5, configuration data stored in the FPGA memory is transferred along data lines 4 into the internal storage device of the FPGA. The configuration data programs the FPGA, by altering the electrical state of selected logic gates in the array, to perform one or more desired combinational logic functions. If desired, the FPGA may be configured to receive configuration data from a source other than the FPGA memory, such as an external microprocessor.

The programmable logic circuit of the present invention represents a significant technological advance over prior art FPGA-based systems. Through its selection of an FPGA memory which is both non-volatile and in-circuit programmable, the circuit of the present invention is able to become optimized because it achieves all of the advantages of FPGA memories known in the prior art without realizing their disadvantages.

For example, prior art circuits which use ROM-based FPGA memories, such as the one disclosed in the Koz patent, offer the advantage of being non-volatile. A ROM-based FPGA memory, however, is not optimal because it is not in-circuit programmable. Consequently, the functionality of the FPGA cannot be changed without first having to remove the FPGA memory and either reprogram it or replace it with a new programmed chip.

The FPGA memory used in the programmable logic circuit of the present invention retains the advantages of a ROM-based memory without realizing its disadvantages. It is non-volatile and, in contrast to a ROM-based FPGA memory, is in-circuit programmable, i.e., the FPGA memory is programmable, by a customer or user, after installation into the system circuitry. Furthermore, the functionality of the FPGA can be changed simply by reprogramming the memory with different configuration data while the memory is in circuit.

Prior art circuits which use RAM-based FPGA memories, such as those disclosed in the McAuliffe patents, offer the advantage of being in-circuit programmable. A RAM-based FPGA memory, however, is not optimal because the RAM is a static memory. Consequently, the data contained therein is lost when power is removed from the system and therefore has to be reprogrammed every time the system is turned on. The need to reprogram upon every system power up introduces delays and increases system hardware requirements.

The FPGA memory used in the programmable logic circuit of the present invention retains the advantage of a RAM-based FPGA memory without realizing its disadvantages. It is in-circuit programmable and, in contrast to a RAM-based FPGA memory, is non-volatile, which means that configuration data stored therein remains there after power to the system is removed. Thus, unlike a RAM-based FPGA, programming of the FPGA memory of the present invention need only take place once. This advantageously improves the speed and efficiency of the overall system in which the memory is employed.

It is also important to note that the programmable logic circuit of the present invention can manufactured as a single generic part, thus promoting the goals of circuit standardization and automated assembly.

For at least the reasons set forth above, it is clear that the programmable logic circuit of the present invention, through its selection of a non-volatile, in-circuit programmable FPGA memory, optimizes the overall performance of the FPGA system.

The method of the present invention for programming an FPGA memory to perform one or more desired functions, unlike any prior art method, focuses on using the FPGA to program the FPGA memory with configuration data.

The method of the present invention may be explained with reference to the programmable logic circuit shown in FIG. 1.

In a first step, a download cable 7 is connected between an external source 6 and the FPGA. The external source may, for example, be a microprocessor-based system.

In a second step, power is supplied from supply 5 to the FPGA and FPGA memory, thereby readying the internal storage device in the FPGA to accept configuration data.

In a third step, a first set of data is downloaded from the external source to the internal storage device of the FPGA through a cable 7. The first set of configuration data configures the FPGA to function as a programmer for programming the FPGA memory.

In a fourth step, a second set of data is downloaded from the external source to the FPGA through cable 7. This second set of data is the configuration data for programming the FPGA to perform the one or more desired system functions. However, for reasons that will become apparent, this second set of data is not loaded into the internal storage device of the FPGA at this time.

In a fifth step, the FPGA programs the FPGA memory with the second set of data in a manner controlled by the programming function of the FPGA.

In an optional sixth step, the FPGA memory may be reprogrammed by repeating the previous five steps with a different second set of configuration data.

The method of programming an FPGA memory in accordance with the present invention is superior to prior art methods in several ways. First, by making use of existing circuit components (e.g., the FPGA), the hardware requirements, and thus the cost, for programming the FPGA memory are reduced substantially compared with prior art systems. Second, unlike many prior art methods, the method of the present invention need only be performed once. Third, the method of the present invention may be implemented by the customer/user, instead of the manufacturer, thus making programming, and reprogramming of the system if desired, more convenient and efficient compared with prior art methods.

The method of the present invention for programming an FPGA is also performed while the FPGA and FPGA memory are in circuit. Initial programming of the FPGA involves, in a first step, selecting a non-volatile, programmable memory to serve as the FPGA memory.

In a second step, the FPGA memory, while in circuit with the FPGA, is programmed with configuration data in accordance with the five-step method previously described.

In a third step, power is removed from both the FPGA and the now-programmed FPGA memory. Turning off the power causes the first set of data stored in the internal storage device of the FPGA to be erased, thereby readying the FPGA to accept new configuration data.

In a fourth step, power is restored to the FPGA and FPGA memory. This causes the second set of data stored in the FPGA memory to be loaded into the internal storage device of the FPGA to program the FPGA to perform its one or more desired functions.

Advantageously, because the FPGA memory is selected to be non-volatile, programming of the FPGA memory with configuration data need only be performed once. For all times subsequent to the initial programming, the FPGA is programmed merely by switching on the power, whereupon, as provided in the fourth step, configuration data is automatically loaded into the FPGA internal storage device.

In an optional fifth step, the functionality of the FPGA may be changed by repeating the first four steps in the method described immediately above with a different second set of configuration data.

The programmable logic circuit of the present invention may be embodied within a variety of IC chip packages. The IC chips containing the FPGA and FPGA memory circuits may, for example, be embodied within individual (e.g., DIP) IC packages and then mounted onto a printed circuit board. That board may then be incorporated into a larger system to perform therein its intended functions.

Alternatively, the programmable logic circuit of the present invention may be incorporated within an MCM package, which is another variation of the present invention that will now be discussed.

Figure 2:
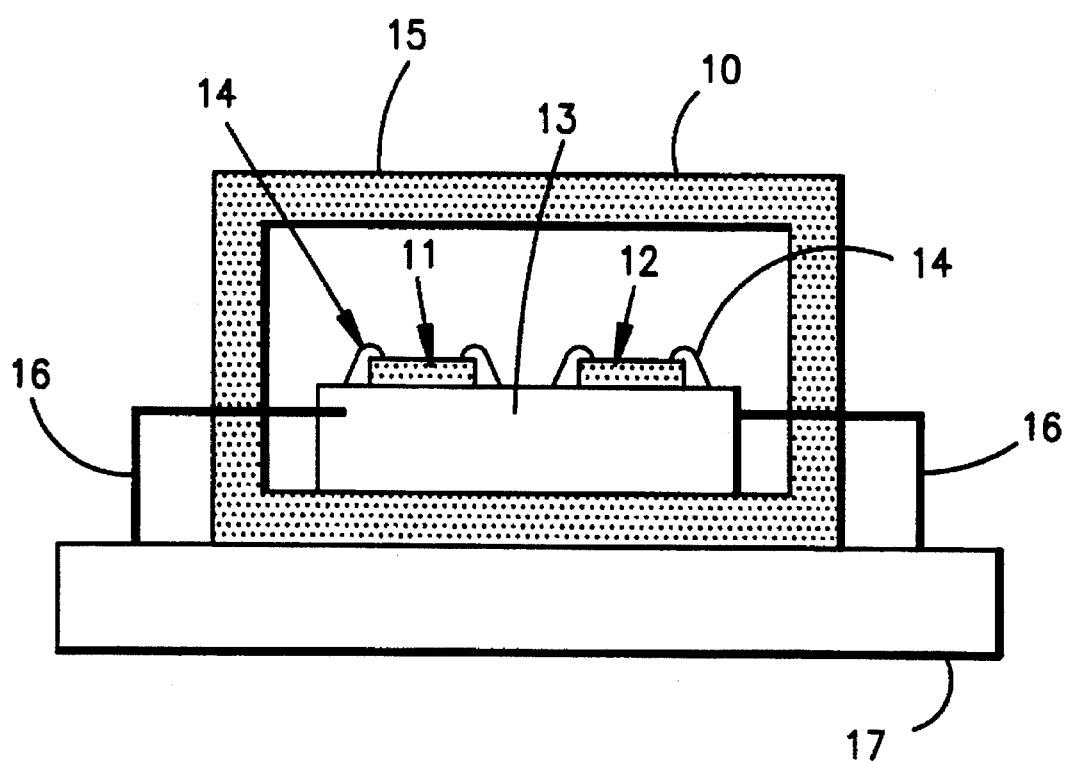
FIG. 2 is a schematic diagram of a preferred embodiment of an MCM containing a FPGA and FPGA memory die in accordance with the present invention.

As shown in FIG. 2, the MCM 10 of the present invention includes an FPGA die 11 and an FPGA memory die 12 mounted on a common circuit base 13. Conductive paths (not shown), incorporated within the base, serve as data lines for carrying signals, and more specifically configuration data, between the FPGA and FPGA memory dies. Very fine signal, power, and Found wires, shown generally by numeral 14, connect I/O bonding pads (not shown) along the periphery of the dies to the conductive paths. These wires also serve to secure the dies to the base. The aforementioned components are all embodied within an outer casing 15, which protects the circuit dies from dust, spurious static charges and the like. The conductive paths within the base are electrically connected to external system circuitry, which may be located on a printed wiring board 17, by wires 16. By way of example, an MCM of this type was incorporated by the inventor into a travelling wave tube modulator for use in a radar system.

Incorporating the programmable logic circuit of the present invention into an MCM package offers a number of advantages which the circuit could not realize if its ICs were individually packaged using conventional techniques. The MCM package of the present invention, for example, is substantially smaller in size and therefore take up less board space within the system circuit. It also requires fewer chip connections and interconnections, which translate into a reduction in parasitic capacitances and inductances and signal delays, all of which increase overall system speed and reliability.

EXAMPLE

Figure 3:
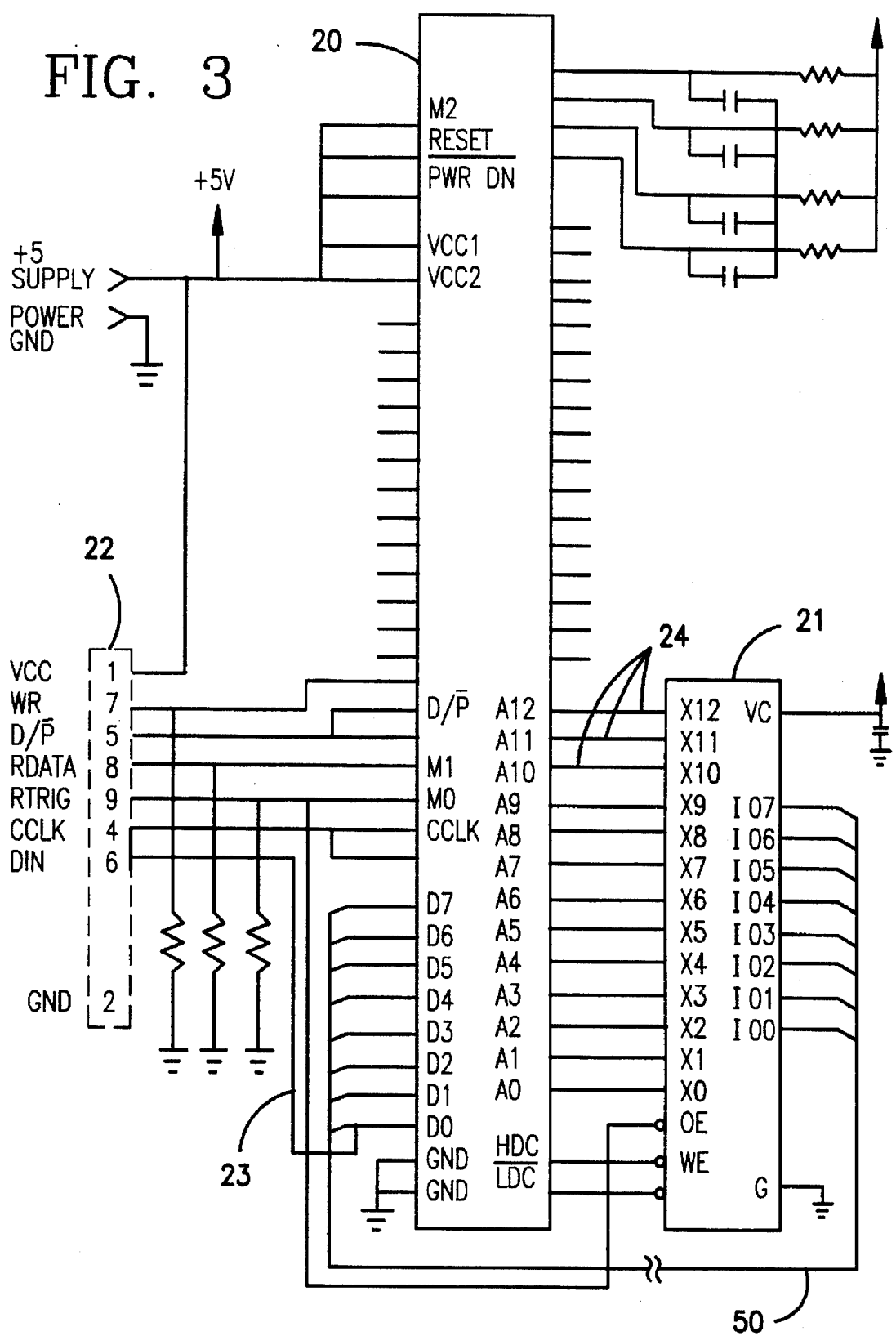
FIG. 3 is a circuit diagram of the programmable logic circuit of the present invention.
Figure 4:
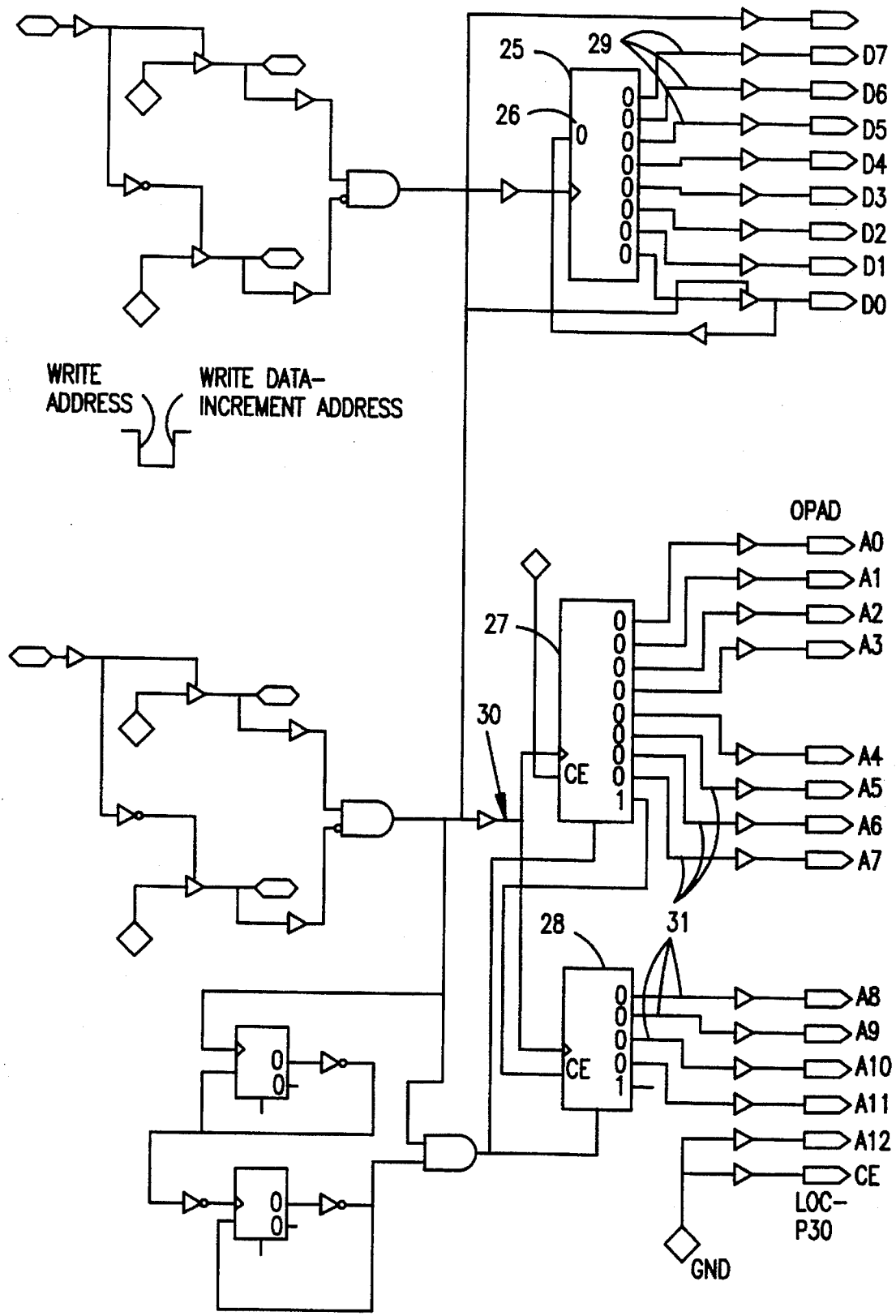
FIG. 4 is a circuit diagram of the internal logic of an FPGA chip to be incorporated within the programmable logic circuit of the present invention.
Figure 5:
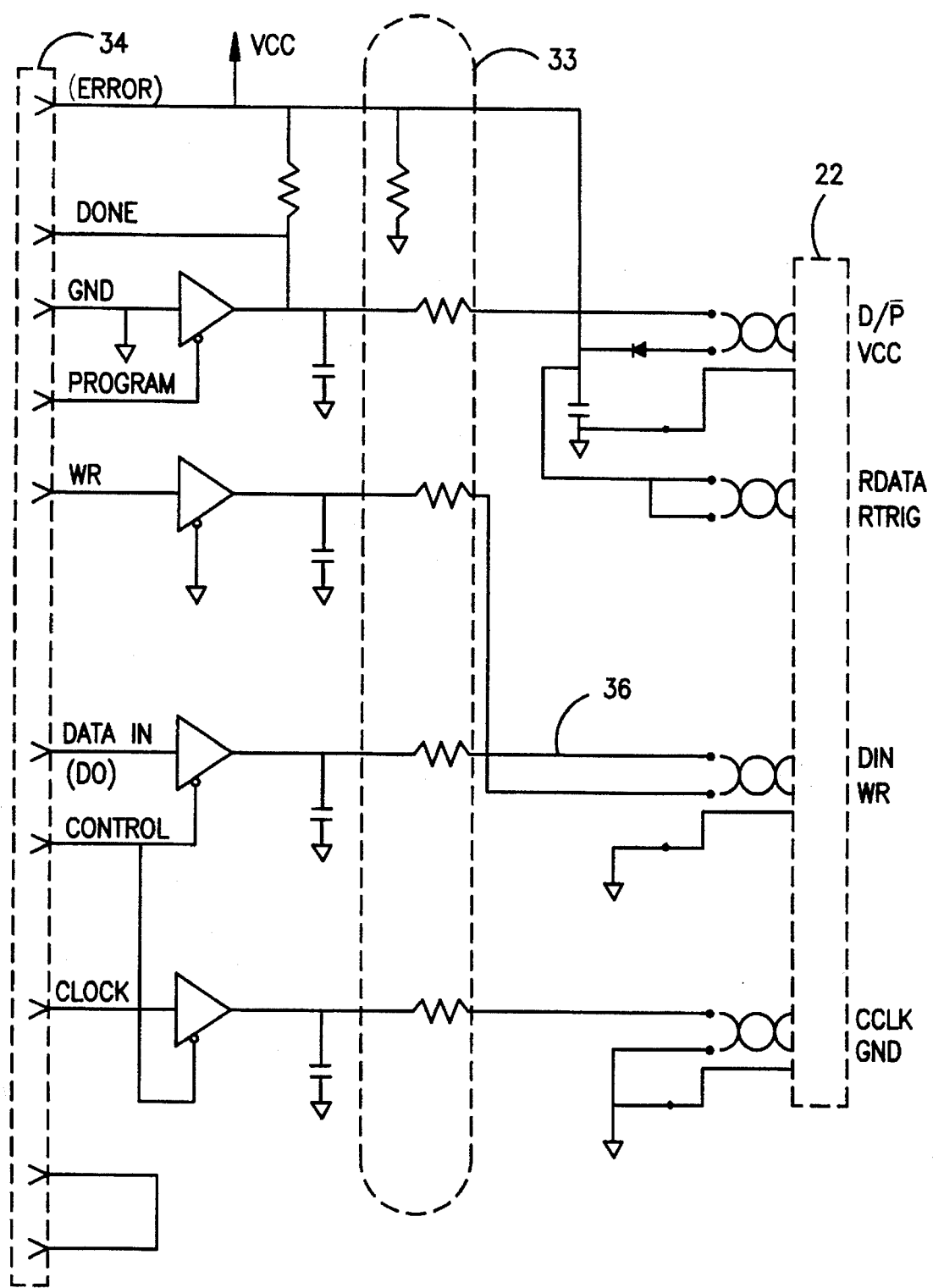
FIG. 5 is a circuit diagram of a download cable for conveying configuration data from an external source to an FPGA chip used within the programmable logic circuit of the present invention.

An example of the programmable logic circuit of the present invention is shown in FIGS. 3, 4, and 5. The circuit depicted in these figures may be incorporated within either of the packages discussed above.

In FIG. 3, a circuit diagram showing the programmable logic circuit of the present invention includes an FPGA chip 20, an FPGA memory chip 21, a communications port 22, a data-in line 23, a plurality of address lines 24 situated between the FPGA chip and the FPGA memory chip, and a plurality of data lines 50 also disposed between the FPGA and FPGA memory.

The FPGA chip contains a pair of inputs pins VCC1 and VCC2 for receiving power from a +5 volt power supply, a pair of input pins GND1 and GND2 for connecting the FPGA to ground, a clock input CCLK, a plurality of data pins D0–D7, and a plurality of address pins A0–A12. The FPGA chip depicted is an XC3120 PC68 made by Xilinx, however one of ordinary skill in the art will appreciate that any of the FPGA devices made by Xilinx, as well as FPGA devices made by other manufacturers, may be used.

The FPGA memory is a non-volatile, programmable memory equipped with a pin VC connected to a +5 V power supply, an input G connected to ground, a plurality of input/output pins IO0–IO7 for conversing with pins D0–D7 on the FPGA along data lines 50, and a plurality of pins X0–X12 for receiving addresses from address pins A0–A12 along lines 24. The FPGA memory depicted is an EEPROM model X28C64D made by XICOR, however one of ordinary skill in the art will appreciate that virtually any EEPROM device may be used in accordance with the present invention. Additionally, the circuit shown in FIG. 3 may be modified to operate with either an EPROM or PROM memory.

The communications port 22 is mounted on a printed circuit board (not shown) containing the programmable logic circuit of the present invention.

A schematic diagram of the internal logic of the FPGA chip shown in FIG. 4 includes a serial-to-parallel converter circuit 25 and two counter chips 27 and 28.

The serial-to-parallel converter circuit includes an input 26 linked to data pin D0, eight internal data registers (not shown) for generating an 8-bit word from data received serially from input 26, and a plurality of traces 29 connecting the registers to respective data pins D0–D7. Not shown but included within the FPGA chip is a static RAM for receiving, through pin D0, configuration data for defining the functionality of the FPGA.

The two counter chips collectively form a 12-bit address counter for controlling the input of configuration data into the EEPROM. Each chip contains a chip enable input CE for receiving from a common clock line 30 clock signals for incrementing the address count during EEPROM programming. A plurality of traces 31 are used to convey addresses to respective address pins A0–A12.

FIG. 5 shows a circuit diagram of a download cable 33 connecting a communications port 34, located on an external source (not shown), to communications port 22. The cable includes a data line 36 for conveying configuration data from the external source, which in this example was an IBM compatible computer, into the D0 input of the FPGA via a data-in line 23 emanating from port 22.

The method of the present invention for programming the EEPROM was accomplished in accordance with the following steps:

1. connecting respective ends of download cable 33 to communications ports 34 and 22.
2. turning on the power supply to the FPGA and FPGA memory.
3. downloading configuration data for programming the FPGA to function as an EEPROM programmer from the communications port of the IBM computer to port 22 along data line 36 within the download cable. (Downloading EEPROM programmer configuration data was controlled by download software provided by Xilinx.)

From port 22, the data travelled along data-in line 23 until it reached the D0 input pin of the FPGA, at which time it was loaded into the internal static RAM of the FPGA chip to program the FPGA to function as an EEPROM programmer.

4. downloading, through the cable in a similar manner, configuration data for programming the FPGA to perform its one or more desired logic functions from the computer to the D0 input of the FPGA. (Downloading FPGA application configuration data was controlled by a Qbasic program designed by the inventor for this purpose.)

Once inside the FPGA, the data was transported to input 26 of the serial-to-parallel converter, which converted the data into 8-bit words. The data was then transferred, one word at a time, to output pins D0–D7, where it was then transported across data lines 50 and into input pins IO0–IO7 of the EEPROM. Simultaneously, chips 27 and 28 output, across lines 24 and into pins X0–X12 of the EEPROM, data specifying into which EEPROM memory address each 8-bit word of configuration data was to be written.

5. turning off power to the FPGA and EEPROM chips after all the application configuration data was loaded into the EEPROM. This caused the EEPROM configuration data loaded in the static RAM of the FPGA to become erased, thereby readying the FPGA to receive the configuration data just loaded into the EEPROM. The cable was then removed to complete the programming of the EEPROM.
6. re-establishing power to the FPGA and EEPROM, causing the EEPROM to automatically load its configuration data into the static RAM of the FPGA to program the FPGA to perform the one or more desired system functions.

Other modifications and variations to the invention will be apparent to those skilled in the art from the foregoing disclosure. Thus, while only certain embodiments of the invention have been specifically described herein, it will be apparent that numerous modifications may be made thereto without departing from the spirit and scope of the invention.

What is claimed is:

1. A method for programming a memory with data, to be subsequently used to program an FPGA to perform a desired function, while said memory and FPGA are situated in circuit, said FPGA containing an internal storage means for storing data for altering functioning of the FPGA, and being adapted to communicate with said memory and with an external means, comprising the steps of:

downloading, from said external means, a first set of data into the internal storage means of said FPGA, said first set of data configuring the FPGA to function as a programmer for programming said memory;

downloading, from said external means, a second set of data into said FPGA, said second set of data being a type for configuring said FPGA to perform said desired function; and programming said memory with said second set of data in a manner controlled by the programming function of said FPGA.

2. A method as defined in claim 1, further comprising:

selecting said memory to be of a type which is non-volatile, so that said second set of data programmed into said memory will be retained therein after power to said memory is turned off.

3. A method as defined in claim 2, wherein said non-volatile memory is selected from a group consisting of EEPROM, EPROM, and PROM.

4. A method as defined in claim 1, further comprising:

reprogramming said memory by repeating the preceding steps with a different second set of data.

5. A method as recited in claim 1, wherein said external means is a microprocessor-based system.

6. A method as defined in claim 1, wherein the FPGA and memory are bare integrated circuit dies incorporated within an MCM package.

7. A method for programming an FPGA while in circuit to perform a desired function, said FPGA containing an internal volatile storage means for receiving therein data for altering functioning of the FPGA, said method comprising the steps of:

providing a non-volatile memory in circuit with said FPGA;

supplying power to the FPGA and memory;

downloading, from an external source, a first set of data into the internal storage means of said FPGA, said first set of data configuring the FPGA to function as a programmer for programming said memory;

downloading, from the external source, a second set of data into said FPGA, said second set of data being a type for configuring said FPGA to perform said desired function;

programming said memory with said second set of data in a manner controlled by the programming function of said FPGA;

removing power from the FPGA and memory, thereby causing the first set of data to become erased from the internal storage means of the FPGA; and re-supplying the FPGA and memory with power, to thereby cause the second set of data within said memory to be automatically loaded into the internal storage means of the FPGA to program the FPGA to perform the desired function.

8. A method as recited in claim 7, wherein said memory is selected from a group consisting of EEPROM, EPROM, and PROM.

9. A method as recited in claim 7, further comprising the step of:

reprogramming the FPGA by repeating the preceding steps with a different second set of data.

10. A method as defined in claim 7, wherein said external source is a microprocessor-based system.

11. A method as defined in claim 7, further comprising:

connecting an interface between the FPGA and the external source, said interface being used to transfer said first and second sets of data from said source into the internal storage means of said FPGA.

12. A method as defined in claim 7, wherein the FPGA and the non-volatile memory are bare integrated circuit dies incorporated within an MCM package.

13. A programmable logic circuit for performing a desired function comprising:

an FPGA connected to an external source for receiving a first set of data to configure the FPGA as a programmer for an FPGA memory, and for receiving a second set of data for transfer to the FPGA memory under control of said FPGA configured as an FPGA memory programmer, said second set of data being subsequently used to configure the FPGA so as to perform a desired function.

14. A programmable logic circuit according to claim 13, wherein said FPGA memory is a non-volatile, in circuit programmable memory.

15. A programmable logic circuit for performing a desired function comprising:

an FPGA and an FPGA memory;

means for entering programming data to the FPGA so as to function as an FPGA memory programmer;

means for entering configuration data into the FPGA memory;

means for erasing the programming data from the FPGA; and means for loading the configuration data from the FPGA memory to the FPGA to program the FPGA so as to perform at least one desired system function.

16. A programmable logic circuit according to claim 15, wherein said FPGA memory is a non-volatile, in circuit programmable memory.

* * * * *